United States Patent [19]

Harper et al.

[11] 4,296,194
[45] Oct. 20, 1981

[54] POSITIVE-WORKING LIGHT SENSITIVE DIAZO MATERIALS WITH AZO DYE

[75] Inventors: Terence Harper, Leeds; Allen P. Gates, Knaresborough, both of Great Britain

[73] Assignee: Vickers Limited, London, England

[21] Appl. No.: 122,190

[22] Filed: Feb. 19, 1980

Related U.S. Application Data

[63] Continuation of Ser. No. 895,070, Apr. 10, 1978, abandoned.

[30] Foreign Application Priority Data

Apr. 12, 1977 [GB] United Kingdom ............... 15144/77

[51] Int. Cl.³ .......................... G03C 1/60; G03C 1/54
[52] U.S. Cl. .................................... 430/176; 430/179; 430/191; 430/192; 430/193; 430/292; 430/293; 430/294; 430/302
[58] Field of Search ............... 430/175, 191, 193, 292, 430/293, 294, 176, 179, 192, 302

[56] References Cited

U.S. PATENT DOCUMENTS

| | | |
|---|---|---|
| 3,046,115 | 7/1962 | Schmidt et al. ..................... 430/193 |
| 3,046,117 | 7/1962 | Sus ..................................... 430/191 |
| 3,373,021 | 3/1968 | Adams et al. ...................... 430/180 |
| 3,890,152 | 6/1975 | Ruckert et al. .................... 430/175 |
| 3,929,488 | 12/1975 | Smith ................................ 430/191 |
| 3,969,118 | 7/1976 | Stahlhofen et al. ............... 430/191 |
| 3,984,253 | 10/1976 | Nelson .............................. 430/292 |
| 4,163,672 | 8/1979 | Stahlhofen et al. ............... 430/191 |

FOREIGN PATENT DOCUMENTS

| | | | |
|---|---|---|---|
| 52-29303 | 3/1977 | Japan ................................ | 430/292 |
| 1041463 | 4/1962 | United Kingdom ............... | 430/292 |
| 1039475 | 8/1966 | United Kingdom ............... | 430/292 |

*Primary Examiner*—Charles L. Bowers, Jr.
*Attorney, Agent, or Firm*—Larson and Taylor

[57] ABSTRACT

A positive working light-sensitive composition comprises in admixture (a) a first component which is an azo dye formed by reacting a p-amino-benzene diazonium salt and a compound including the grouping

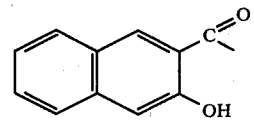

and (b) a second component which includes a o-quinone diazide and/or a diazonium compound and which, on exposure to light produces an acidic light decomposition product which is capable of reacting with the azo dye to produce a material having a color different to that of the azo dye. The composition exhibits a color change on exposure to light and is useful for the manufacture of light sensitive plates for use in lithographic printing plate production.

10 Claims, No Drawings

POSITIVE-WORKING LIGHT SENSITIVE DIAZO MATERIALS WITH AZO DYE

This is a continuation of application Ser. No. 895,070, filed Apr. 10, 1978, now abandoned.

This invention relates to positive working light-sensitive compositions and is concerned with such compositions which are suitable for, for example, the production of lithographic printing plates by photo-mechanical methods.

Photo-mechanical methods of preparing printing plates comprise producing a light-sensitive plate by coating a light-sensitive composition onto a suitable substrate e.g. of anodised aluminium, image-wise exposing the light-sensitive plate so that the light-struck areas of the composition and the non-light struck areas of the composition have differing solubility in a liquid and then developing the image-wise exposed plate with the liquid to selectively remove the more soluble of the areas. In the case where the light-sensitive composition is negative working, the non-light-struck areas are removed whereas the light-struck areas are removed in the case where the light-sensitive composition is positive working. Those areas of the composition remaining on the substrate after development constitute the final ink-receptive printing image of the printing plate and the water-receptive non-printing areas of the printing plate are constituted by the surface of the substrate revealed on development.

In these procedures it is desirable for a colour change to take place in the light-struck areas so as to render them visible: this is especially the case in step-and-repeat work where it is necessary to align successive images on the plate. In some cases the colour change inherent in the light-sensitive system used (e.g. in azide sensitised layers) may be sufficient in itself. In other cases, although some colour change occurs on image-wise exposure to light, this is rarely sufficient in practice to enable the image to be visibly inspected. This is particularly the case with light-sensitive compositions based on quinone diazides or diazonium salts.

Light-sensitive compositions comprising positive working quinone diazides, usually in admixture with a novolak resin, are used to a large extent in printing plate manufacture but, as aforementioned, they suffer from the disadvantage that they do not ordinarily undergo an adequate colour change on exposure to light. On exposure to light of light-sensitive compositions based on such quinone diazides, the quinone diazide is converted to an indene carboxylic acid [via a ketene intermediate: Cf, O Süs, Annalen, 556, 65–84 (1944)], thus rendering the composition soluble in and developable by an aqueous alkaline developer. Although there is a slight colour change from the original yellow colour on exposure, even with the aid of the addition of a contrast-providing dye, for example a violet dye, it is difficult to see the light-struck areas in the yellow safe-light that is usually employed in the working area.

Although a number of dyes are known which, when incorporated in light-sensitive coatings are capable of reacting with acidic light decompositions products of materials in the coating to give brightly coloured non-image areas on exposure, these are generally yellow in colour and hence the final image constituted by the non-light struck areas of the coating will also be yellow and thus difficult to see under the yellow safelight. The incorporation in the light-sensitive composition, of an additional dye having a stronger colour can improve the "visibility" of the final image but also tends to reduce the contrast between the light struck and non-light struck areas and may adversely affect the sensitivity and developability of the plate.

According to the present invention, there is provided a positive working light sensitive composition which exhibits a colour change upon exposure to light, which composition comprises in admixture (a) a first component which is an azo dye formed by reacting a p-aminobenzene diazonium salt and a compound including the grouping

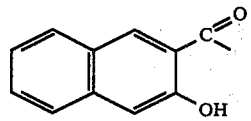

and (b) a second component which includes an o-quinone diazide and/or a diazonium compound and which, on exposure to light, produces an acidic light decomposition product which is capable of reacting with the azo dye to produce a material having a colour different to that of the azo dye.

The o-quinone diazide or diazonium compound of the second component may be such as to produce the desired light decomposition product. Alternatively, or additionally, the second component may include a substance, other than the o-quinone diazide or diazonium compound, which produces the desired acidic light decomposition product. Examples of such substances are halogenated hydrocarbons, such as iodo form, and sulphonyl halides.

The p-amino benzene diazonium salt may be unsubstituted but preferably it has substituent groups on the amino nitrogen atom and possibly also in the aromatic ring.

Examples of p-amino benzene diazonium salts which may be used to form the azo dye are:

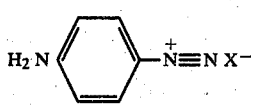

(i)

4-aminobenzenediazonium salt

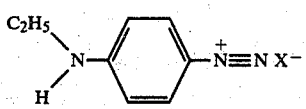

(ii)

4-N-ethylaminobenzenediazonium salt

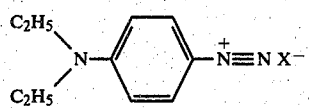

(iii)

4-N,N-diethylaminobenzenediazonium salt

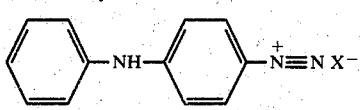

(iv)

diphenylamine-4-diazonium salt

-continued

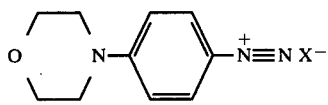

4-morpholinobenzenediazonium salt

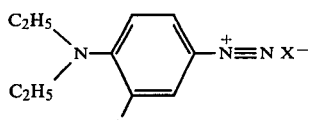

3-chloro-4-(N,N-diethylamino)benzenediazonium salt

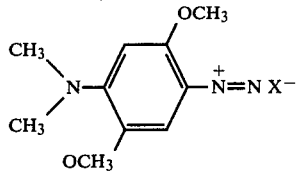

2,5-dimethoxy-4-(N,N-dimethylamino)benzenediazonium salt where X is a suitable anion such as Cl or $(ZnCl_4{}^{2-})_{\frac{1}{2}}$ Said compound used to form the azo dye by reaction with the p-amino benzene diazonium salt may be 3-hydroxy-2-naphthoic acid or a suitable derivative thereof. Examples of such derivatives are:

| | | |
|---|---|---|
| (i) | ![structure] | methyl 3-hydroxy-2-naphthoate |
| (ii) | ![structure] | 3-hydroxy-2-naphthamide |
| (iii) | ![structure] | 3-hydroxy-2-naphthanilide |
| (iv) | ![structure] | 3-hydroxy-2-naphth-o-toluidide |
| (v) | ![structure] | 3-hydroxy-7-methoxy-2-naphthanilide |
| (vi) | ![structure] | 3-hydroxy-2-[N-(2-amino-ethyl)]-naphthamide |
| (vii) | ![structure] | 3-hydroxy-2-naphthoic acid piperidide |
| (viii) | ![structure] | 3-hydroxy-2-naphth-p-anisidide |
| (ix) | ![structure] | 4-chloro-2,5-dimethoxy-anilide of 3-hydroxy-2-naphthoic acid |

The azo dyes used in the compositions of the present invention have the general formula:

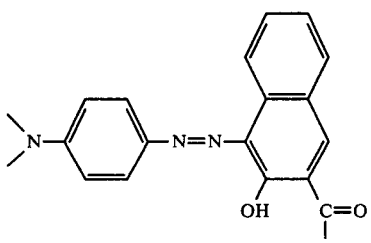

The azo dyes have a colour which is readily visible in yellow safelight but are not light-sensitive, or not sufficiently so that any fading reaction which does take place on exposure to light provides an adequate colour change. Of the contrary, they react with the acidic light decomposition products of the second component of the composition to form a substance of different colour to that of the azo dye. The light-struck areas thus exhibit a colour change (usually by fading to a much paler shade) but the colour of these areas remains sufficiently strong to enable the platemaker to see clearly all areas of the composition which have been struck by light and which need to be removed completely during development. Thus, both the light struck areas and the non-light struck areas are sufficiently coloured to allow the presence of any residual material left after development to be detected and the quality of the final image to be ascertained under the yellow safelight. It has also been found that the compositions of the present invention have a reduced tendency to stain the non-printing areas when used in lithographic printing plate production.

In order to facilitate coating a substrate with the composition to form a light sensitive plate or to improve upon the properties of a printing plate produced from such a light sensitive plate, it may be desirable to include, in the composition of the present invention, materials such as a novolak resin, other non-light sensitive polymers, plasticisers or stabilisers.

The following Examples illustrate the invention:

EXAMPLE 1

3-Hydroxy-2-naphth-o-toluidide (20 g) was dissolved in dimethylformamide (400 ml) and the resultant solution was then filtered and subsequently added dropwise to a stirred solution of sodium hydroxide (2.73 g) in water (400 ml). Sodium carbonate (12.25 g) was added and the pH adjusted to 12 to 13. Para-N,N-diethylaminobenzene diazonium zinc chloride double salt (20 g) in a 1% solution of citric acid (150 ml) was introduced slowly and with stirring into the toluidide solution, previously cooled to 0°–5° C., over a period of 30 minutes. The mixture was stirred for a further 3 hours and filtered. The residue was washed with water and then treated with dilute hydrochloric acid to yield the azo dye 3-hydroxy-4-(p-N,N-diethylaminophenylazo)-2-naphth-o-toluidide.

A light sensitive coating composition was prepared comprising a first component consisting of 0.16 g of the above azo dye; a second component consisting of 1.0 g of the product obtained by the esterification of 1 mole 2,3,4-trihydroxybenzo phenone with 2 moles of naphthoquinone-(1,2)diazide-(2)-5-sulphonyl chloride and 0.16 g of 4-dimethyl aminobenzene diazonium tetrafluoroborate; 5.7 g. of a cresol-formaldehyde novolak resin; and 80 ml of acetone.

The composition was applied by means of a whirler to the surface of grained and anodised aluminium lithographic plate base and the coated plate was then dried. The resultant light-sensitive plate was exposed for 2 minutes in a printing down frame and in contact with a positive transparency to a 4000 watt pulsed xenon lamp at a distance of 0.65 meters. During exposure the colour of the plate was seen to change from a dark green to a pink in the light-struck areas.

The exposed plate was developed with 8% sodium metasilicate solution to remove the light struck areas and leave a final image constituted by the non-light struck areas which were readily visible in yellow safelight. When mounted on a lithographic printing press the developed plate provided many satisfactory copies.

EXAMPLE 2

Example 1 was repeated four times but using as the dye the following compounds in turn:

i. 3-hydroxy-4-(p-N,N-diethylaminophenylazo)-2-[N-(2-aminoethyl)]-naphthamide. Colour change: green to pink.

ii. 3-hydroxy-4-(p-N,N-diethylamino-3-chlorophenylazo)-2-naphth-o-toluidide. Colour change: brown red to pink.

iii. the 4-chloro-2,5-dimethoxyanilide of 4-(diphenylamine-4-azo)-3-hydroxy-2-naphthoic acid. Colour change: green to grey.

iv. 3-hydroxy-4-(p-diethylaminophenylazo)-2-naphthoic acid. Colour change: green to pink.

EXAMPLE 3

A light sensitive plate was produced and processed as in Example 1 but using as the light-sensitive composition a mixture comprising a first component consisting of 0.05 g. of 3-hydroxy-4-(p-N,N-diethylaminophenylazo)-2-naphth-p-anisidide; a second component consisting of 2 g. of diazo RO 220 and 0.05 g. of 4-dimethylaminobenzene diazonium tetrafluoro-borate; and 25 ml of acetone.

Diazo RO 220 is a light-sensitive naphthoquinone(1,2)-diazide(2)-5-sulphonic acid ester of a resin.

The colour change was similar to that obtained in Example 1.

EXAMPLE 4

Example 3 was repeated using 0.1 g. iodoform in place of the 4-dimethylamino benzene diazonium tetrafluoroborate. A similar colour change was obtained.

EXAMPLE 5

A light sensitive plate was produced and processed as in Example 1 but using as the light sensitive composition a mixture comprising a first component consisting of 0.25 g. of the 4-chloro-2,5-dimethoxy anilide of 4-(4$^1$-morpholino-2$^1$, 5$^1$-diethoxyphenylazo)-3-hydroxy-2-naphthoic acid; a second component consisting of 1.65 g. of diphenylamine-4-diazonium fluoroborate; 12 g. of cresol-formaldehyde novolak resin; 180 ml of acetone; and 100 ml of ethyl methyl ketone After exposure the plate was developed in 1% sodium hydroxide solution. During exposure the colour of the plate was seen to change from green to pink.

EXAMPLE 6

A light sensitive plate was produced and processed as in Example 1 but using as the light sensitive composition a mixture comprising a first component consisting of 0.16 g of 3-hydroxy-4-(p-N-ethyl-N-hydroxyethylphenylazo)-2-naphthpiperidide; a second component consisting of 0.32 g. of 4-chloro-3-nitro-benzene sulphonyl chloride and 1 g of the product obtained by the esterification of 1 mole of 2,4-dihydroxybenzophenone with 2 moles of naphthoquinone-(1,2-diazide-(2)-5-sulphonyl chloride; 5.7 g. of cresol-formaldehyde resin; and 80 ml of acetone.

The colour change during exposure was again green to pink

We claim:

1. A positive working light-sensitive composition which exhibits a colour change upon exposure to light, which composition comprises in admixture (a) a first component which is an azo dye formed by reacting a p-aminobenzene diazonium salt and a compound selected from 3-hydroxy-2-naphthoic acid and acid derivatives thereof and (b) a second component which includes a non-light sensitive polymer and and o-quinone diazide and/or a diazonium compound and which, on exposure to light, produces an acidic light decomposition product which is capable of reacting with the azo dye to produce a material having a colour different to that of the azo dye.

2. A composition as claimed in claim 1 wherein the diazonium salt from which the azo dye is formed is a 4-aminobenzene diazonium salt, a 4-N-ethylaminobenzene diazonium salt, a 4-N,N-diethylamino benzene diazonium salt, a diphenylamine-4-diazonium salt, a 4-morpholino benzene diazonium salt, a 3-chloro-4-(N,N-diethylamino) benzene diazonium salt, or a 2,5-dimethoxy-4-(N,N-dimethylamino) benzene diazonium salt.

3. A composition as claimed in claim 1 wherein said compound from which the azo dye is formed is
3-hydroxy-2-naphthoic acid, methyl 3-hydroxy-2-naphthoate,
3-hydroxy-2-naphthamide, 3-hydroxy-2-naphthanilide,
3-hydroxy-2-naphth-o-toluidide, 3-hydroxy-7-methoxy-2-naphthanilide, 3-hydroxy-2-[N-(2-aminoethyl)]-naphthamide,
3-hydroxy-2-naphthoic acid piperidide, 3-hydroxy-2-naphth-p-anisidide, or 4-chloro-2,5-dimethoxy anilide of 3-hydroxy-2-naphthoic acid.

4. A composition as claimed in claim 1 wherein said o-quinone diazide or said diazonium compound produces said acidic light decomposition product.

5. A composition as claimed in claim 1 wherein said second component includes a substance other than said o-quinone diazide or said diazonium compound and said substance produces said acidic light decomposition product.

6. A composition as claimed in claim 5 wherein said substance is a halogenated hydrocarbon.

7. A composition as claimed in claim 6 wherein the halogenated hydrocarbon is iodoform.

8. A composition as claimed in claim 5 wherein said substance is a sulphonyl halide.

9. A light sensitive plate comprising a substrate coated with a composition as claimed in claim 1.

10. A composition as claimed in claim 1 wherein said non-light sensitive polymer is a novolak resin.

* * * * *